FIELD EFFECT TRANSISTOR AMPLITUDE MODULATOR

Filed Jan. 7, 1964

INVENTOR.
Lloyd E. Weberg
BY [signature]
ATT'YS.

United States Patent Office 3,281,718
Patented Oct. 25, 1966

3,281,718

FIELD EFFECT TRANSISTOR AMPLITUDE MODULATOR

Lloyd E. Weberg, Phoenix, Ariz., assignor to Motorola Inc., Franklin Park, Ill., a corporation of Illinois Filed Jan. 7, 1964, Ser. No. 336,255
5 Claims. (Cl. 332—31)

The present invention relates to solid state modulator systems; and it relates more particularly to a low level, solid state modulator, or chopper system, for converting low-amplitude, direct-current signals into alternating-current signals.

The modulator system of the present invention is similar in its characteristics to the prior art mechanical chopper, however, it is capable of operating at much higher frequencies. The usual chopper circuit is used periodically to interrupt a direct-current input signal at a predetermined rate. This enables the direct-current input signal to be converted into an alternating-current output signal, the latter signal having a frequency determined by the rate of operation of the chopper circuit. The resulting alternating-current output signal is amplitude modulated in accordance with variations in the amplitude of the direct-current input signal, so that the output signal faithfully reflects the amplitude variations of the input signal.

As is well known, chopper circuits are especially useful in the amplification of direct-current signals. For such amplification, the direct-current input signal is converted into an alternating-current signal, and the alternating-current signal is amplified in alternating-current amplifiers. This is preferable, because alternating-current amplifiers are inherently more stable than direct-current amplifiers. The resulting amplified alternating-current signal may then be reconverted into a direct current output signal. The latter output signal corresponds to the input signal in amplified form.

As mentioned, the system of the present invention finds particular utility in the amplification of direct-current or low frequency input signals. It is especially useful in the amplification of low-level, direct-current signals, or low-level low-frequency signals, such as derived, for example, from thermocouples, strain gages, photocells, and the like.

A feature of the system of the invention is the incorporation of a field effect transistor into a low level modulator, or chopper circuit. The field effect transistor includes, for example, a gate electrode, a source electrode and a drain electrode.

The field effect transistor, also known as the unipolar transistor, does not operate by injection and is not a transistor, in the usual sense. The field effect transistor includes a channel of relatively high resistivity semi-conductor material. This channel is bounded by a p-n junction and there is a gate region on the other side of the junction. Ohmic contacts, known as the source and the drain, are connected to the ends of the channel; and an ohmic contact, known as the gate, is affixed to the gate region.

The gate is reverse-biased to the source end of the channel, and an increased voltage on the gate functions to decrease the current through the channel between the source and the drain until the drain current saturates. After saturation, the drain current remains nearly constant with increasing drain voltage until breakdown of the junction occurs. The voltage and current values at which the drain current saturates are known as the pinch-off values since the spreading depletion region of the junction fills (pinches off) the channel at those values.

The field effect transistor exhibits high input impedance as compared with the usual transistor. The characteristics of the field effect transistor are similar to those of a vacuum tube pentode.

The field effect transistor is particularly advantageous in the modulator, or chopper circuit of the present invention, not only because of its high input impedance, but since it exhibits zero offset voltage.

The usual transistor is established in a conductive condition by the introduction, for example, of a bias base current into the transistor. When such a transistor is used, for example, in a chopper circuit, by which the emitter-collector impedance is to be reduced essentially to zero during the conduction of the transistor, the control source applying the biasing current to the base causes an offset voltage to appear in the emitter-collector circuit during the conductive condition. The offset voltage is the drop across the emitter-base junction with the transistor fully conducting.

This offset voltage is temperature sensitive, and it must be compensated, or otherwise eliminated, if the modulator system in which it is used is to provide an output which is independent of temperature.

Many prior art attempts have been made to incorporate the usual type of transistor in a chopper circuit, and to incorporate some means for eliminating the offset voltage. However, these attempts have resulted, for the most part, in relatively complicated circuits and/or in relatively complicated transistor constructions, and have met with but limited success.

The field effect transistor, unlike the ordinary transistor, does not introduce any offset voltage into its source-drain circuit due to the voltage on its gate electrode. The field effect transistor may be analogized to the vacuum tube pentode, as mentioned above. The control of the transistor is voltage, rather than current, as opposed to the usual transistor. The only current which flows into the gate electrode of the field effect transistor is a small leakage current. The usual field effect transistor exhibits a base resistance of the order of $10^{12}$ ohms, and it will be appreciated that the resulting leakage current is actually infinitesimal.

The circuit of the present invention, therefore, in which the field effect transistor is used, does not exhibit any temperature-dependent offset voltage. Because of this, a zero output voltage can be achieved in the circuit of the invention by an input compensation of the order of 2 to 3 microvolts per 100 degree centigrade change in ambient temperature. This is to be compared with the usual prior art compensated system using the usual type of transistor, modified, for example, to be temperature compensating, in which the equivalent input compensation must be of the order of 400 to 500 microvolts per 100 degrees centigrade change in ambient temperature.

In the modulator or chopper system to be described, the field effect transistor is used as a switch. The impedance between the source and drain electrodes of the transistor is controlled to shift, for example, between approximately 1,000 ohms when the switch is closed and 10 megohms when the switch is opened. As mentioned above, the switch is closed when the gate voltage source drops to zero, and it is open when the gate voltage source is a maximum.

It would be ideal for the above-mentioned switch impedance of the field effect transistor to drop to zero when the transistor is conductive. However, the residual impedance in the transistor switch produces a voltage drop which, unlike the aforementioned offset voltage is not derived from the control source, and decreases the efficiency of the chopper. The use of a subsequent high gain degenerative amplifier stage can nullify, for all practical purposes, the effects of this latter voltage on the overall system.

An object of the present invention, therefore, is to provide an improved solid state modulator, or chopper system, for converting low-level, direct-current signals into alternating-current signals.

Another object of the invention is to provide such an improved modulator system which is extremely stable over wide ranges of ambient temperature.

Yet another object of the invention is to provide such an improved modulator system which is reliable in its operation, and which is capable of a relatively long life.

A still further object of the invention is to provide such an improved solid state, low-level modulator, or chopper system which is relatively simple in its construction, and which may be produced and sold at a relatively low price.

A feature of the invention is the provision of a modulator, or chopper system, which utilizes a field effect transistor for increased temperature stability in that the field effect transistor exhibits zero offset voltage.

Other objects, features and advantages of the invention will become apparent from a consideration of the following specification, when the specification is considered in conjunction with the accompanying drawing, in which.

Figure 1:
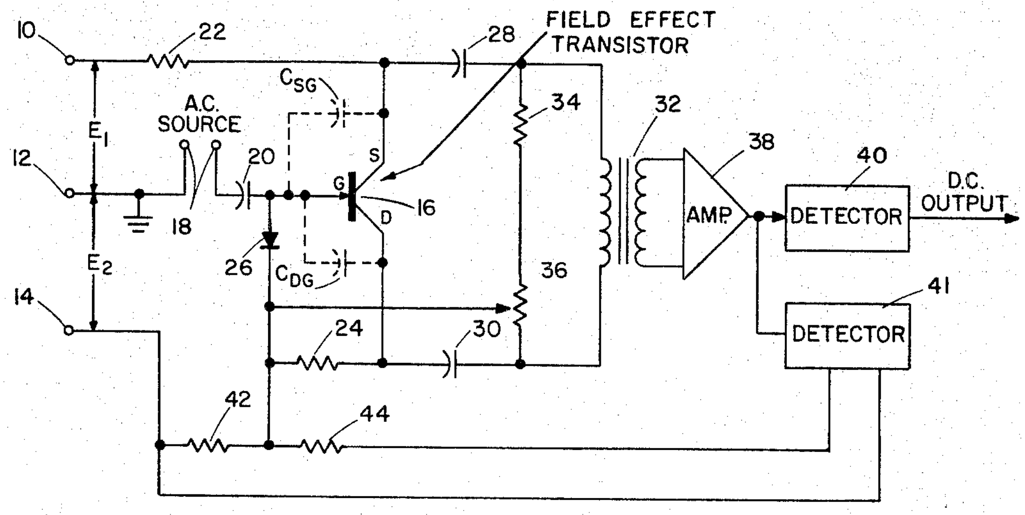
FIGURE 1 is a schematic representation of a solid state modulator, or chopper system, constructed in accordance with one embodiment of the invention.

The modulator circuit of FIGURE 1 may be utilized, for example, to convert the differential of a pair of direct-current input signals into an alternating-current signal. The frequency of the alternating-current signal is determined by a key signal derived from an alternating-current source, as will be described, and the amplitude of the alternating-current signal is a function of the differential of the direct-current input signals.

An input signal is applied across terminals 10 and 14. The input signal is referenced to the grounded terminal 12 in this embodiment, but need not be referenced in this manner. For example, the input may be floating.

A field effect transistor 16 is included in the circuit of FIGURE 1. As mentioned above, the field effect transistor is particularly useful in this environment because of the fact that it does not exhibit any offset voltage.

The aforementioned alternating-current keying signal is introduced to the circuit across a pair of input terminals 18. One of the terminals 18 is grounded, and the other is coupled through a usual coupling capacitor 20 to the gate electrode of the field effect transistor 16. The coupling capacitor 20 may, for example, have a capacity of 0.1 microfarad.

The input terminal 10 is connected through a resistor 22 to the source electrode of the field effect transistor 16, and the input terminal 14 is connected through a feedback circuit (to be described) and through a resistor 24 to the drain electrode of the transistor 16. These resistors serve to prevent the field effect transistor 16 from unduly loading the direct-current input signal sources when it is in its conductive state. Each of the resistors 22 and 24 may, for example, have a resistance of 47 kilo-ohms.

A diode 26 is connected between the gate electrode of the transistor 16 and the resistor 24. This diode serves to assure that the gate electrode will never be driven into its forward conductive region.

The source and drain electrodes of the field effect transistor 16 are coupled through respective direct-current blocking capacitors 28 and 30 to the primary of an output transformer 32. Each of these capacitors may, for example, have a capacitance of 0.1 microfarad.

The alternating-current keying signal applied to the gate electrode of the field effect transistor 16 from the input terminals 18 must be kept out of the circuit of the transformer 32.

However, the field effect transistor does exhibit a leakage capacitance ($C_{SG}$) between the gate and the source electrode, and it also exhibits a leakage capacitance ($C_{DG}$) between the gate and the drain electrode. Unless some neutralizing means is provided, these leakage capacitances would provide a path for the 5 kilocycle alternating-current keying signal into the circuit of the transformer 32.

The neutralizing circuit is provided by means of a resistor 34 and a potentiometer 36, which are series connected across the primary of the transformer 32. The movable arm of the potentiometer 36 is connected back to the junction of the diode 26 and resistor 24. The resistor 34 and the potentiometer 36 may each have a resistance of 100 kilo-ohms. The elements 34 and 36 and the internal capacitances ($C_{SG}$) and ($C_{DG}$) of the field effect transistor form a bridge. The movable arm of the potentiometer 36 is adjusted until the bridge is balanced, and the effects of these leakage capacitances is neutralized.

The secondary of the transformer 32 may be connected to a high gain amplifier 38 which, in turn, may be coupled to a detector 40. The detector 40 serves to return the amplified alternating-current signal from the amplifier 38 to a direct-current state, so that a direct-current output, corresponding to the differential of the direct-current input signals is provided, the output being in amplified form with respect to the aforementioned differential.

A degenerative neutralizing circuit may be provided, this latter circuit including a second detector 41 and a pair of resistors 42 and 44. The resistor 42 is connected, as shown, between the input terminal 14 and the resistor 24. The feedback may be taken from the detector 40 if desired.

Figure 2:
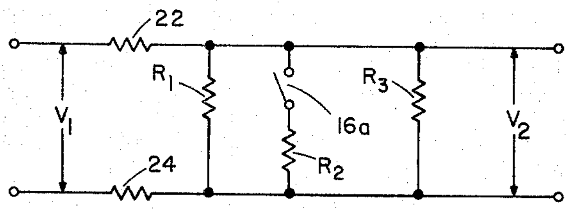
FIGURE 2 is a representation of the equivalent circuit of the system of FIGURE 1.

The equivalent circuit of the system of FIGURE 1 is shown in FIGURE 2. When the field effect transistor 16 is non-conductive, the switch 16*a* of FIGURE 2 is effectively opened. Under such conditions, the field effect transistor exhibits a resistance $R_1$ of the order, for example, of 10 megohms. When the field effect transistor 16 is conductive, the switch 16*a* of FIGURE 2 closes, so that a resistance $R_2$ is effectively connected in shunt with the resistance $R_1$. This latter resistance may have a value, for example, of 900 ohms.

Figure 3:
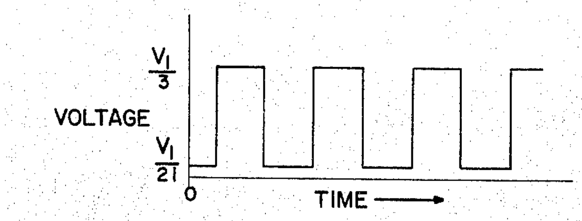
FIGURE 3 is a characteristic curve useful in explaining the operation of the circuit of FIGURE 1.

As mentioned above, under the ideal state, the resistance $R_1$ should be infinite, and the resistance $R_2$ should be zero. However, due to the fact that these resistances must have some finite value, the corresponding signal $V_2$ appearing across the impedance $R_3$ has the value shown in the curve of FIGURE 3.

That is, the voltage $V_2$ has a value corresponding to $V_1/3$ when the switch 16*a* is opened, and it has a value corresponding to $V_1/2^1$, for example, when the switch 16*a* is closed. The voltage $V_2$, applied to the amplifier 38, has essentially a square wave configuration, therefore, and varies between the values shown in FIGURE 3.

It is evident that changes in the minimum value of the signal $V_2$ occur for gain changes in the system of FIGURE 1. However, these gain changes can be minimized in the overall system by providing the degenerative feedback shown in FIGURE 1. With such a system, the direct-current output from the detector 40 is highly stable, and reflects faithfully only variations in the differential of the direct-current input.

The invention provides, therefore, a modulator circuit which is capable of operating at relatively high frequencies, so as to facilitate the construction of the transformer 32, and other components. Moreover, the improved modulator of the invention is highly stable, and capable of operating through relatively wide ranges of ambient temperature, without any appreciable effect on its operating characteristics.

While a particular embodiment of the invention has been shown and described, modifications may be made. The following claims are intended to cover all such modifications which fall within the scope of the invention.

What is claimed is:

1. A modulator circuit including in combination: input terminal means; output circuit means including a transformer having a primary winding and a secondary winding; first resistance means and first capacitance means having a first common junction and being series-connected between said input terminal means and one side of said primary winding; second resistance means and second capacitance means having a second common junction and being series-connected between said input terminal means and the other side of said primary winding; a field effect transistor including a source electrode and a drain electrode respectively connected to said first and second common junctions; said field effect transistor further including a gate electrode and being responsive to an alternating-current keying signal applied to said gate electrode periodically to cause said field effect transistor to be non-conductive; and control circuit means coupled to said gate electrode for applying said keying signal thereto.

2. The modulator circuit defined in claim 1 and which includes resistance means including bridge-balancing potentiometer means connected across said primary winding.

3. The modulator circuit defined in claim 1 in which said input terminal means includes first and second terminals respectively connected to said first and second resistance means and a third terminal connected to a point of reference potential, and in which said control circuit means includes circuitry for introducing said key signal between said gate electrode and said point of reference potential.

4. A modulator circuit including in combination, input circuit means for receiving an applied input signal, output circuit means, coupling circuit means intercoupling said input circuit means and said output circuit means for applying said input signal to said output circuit means, a field effect transistor included in said coupling circuit means and including a source electrode and a drain electrode effectively connecting said field effect transistor across said coupling circuit and in parallel with said input and output circuits, said field effect transistor further including a gate electrode and being responsive to an alternating current keying signal applied to said gate electrode periodically to interrupt said input signal as applied to said output circuit means, circuit means coupled to said gate electrode for applying said keying signal thereto, said coupling circuit means further having a bridge network coupled to said source electrode and to said drain electrode for neutralizing the effects of internal capacitance of said field effect transistor on the modulator circuit.

5. A modulator circuit including in combination, input circuit means for receiving an applied input signal, output circuit means, coupling circuit means intercoupling said input circuit means and said output circuit means for applying said input signal to said output circuit means, a field effect transistor included in said coupling circuit means and including a source electrode and a drain electrode effectively connecting said field effect transistor across said coupling circuit, said field effect transistor further including a gate electrode and being responsive to an alternating current keying signal applied to said gate electrode periodically to interrupt said input signal as applied to said output circuit means, circuit means coupled to said gate electrode for applying said keying signal thereto, said coupling circuit means further having a bridge network coupled to said source electrode and to said drain electrode, said bridge network including adjustable balancing potentiometer means and acting to neutralize the effects of internal capacitance of said field effect transistor on the modulator circuit.

References Cited by the Examiner

UNITED STATES PATENTS

| | | | |
|---|---|---|---|
| 2,939,916 | 6/1960 | Miller | 307—88.5 |
| 3,005,937 | 10/1961 | Wallmark et al. | 307—88.5 |
| 3,018,391 | 1/1962 | Lindsay et al. | 317—234 |

OTHER REFERENCES

"Field Effect Transistors," No. 1, June 1962, Amelco Semi Conductor Div. of Teledyne Inc., Mountain View, Cal., pages 1–7.

ROY LAKE, *Primary Examiner.*

A. L. BRODY, *Assistant Examiner.*